(12) United States Patent
Liu et al.

(10) Patent No.: US 6,326,300 B1
(45) Date of Patent: Dec. 4, 2001

(54) DUAL DAMASCENE PATTERNED CONDUCTOR LAYER FORMATION METHOD

(75) Inventors: Chung-Shi Liu; Chen-Hua Yu, both of Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/157,437

(22) Filed: Sep. 21, 1998

(51) Int. Cl.[7] ............... H01L 21/4763; H01L 21/302; H01L 21/461; H01L 21/31; H01L 21/469

(52) U.S. Cl. ............... 438/638; 438/738; 438/740; 438/783; 438/924

(58) Field of Search .................. 438/624, 638, 438/924, 740

(56) References Cited

U.S. PATENT DOCUMENTS

| | | | |
|---|---|---|---|
| 4,377,437 | 3/1983 | Taylor et al. | 156/628 |
| 4,450,041 | * 5/1984 | Aklufi | 156/628 |
| 4,634,494 | 1/1987 | Taji et al. | 156/628 |
| 4,652,334 | 3/1987 | Jain et al. | 156/628 |
| 4,863,556 | 9/1989 | Reichert | 156/628 |
| 5,444,007 | 8/1995 | Tsuchiaki | 437/35 |
| 5,460,693 | 10/1995 | Moslehi | 156/662.1 |
| 5,550,405 | 8/1996 | Cheung et al. | 257/642 |
| 5,578,523 | 11/1996 | Fiordalice et al. | 437/190 |
| 5,602,053 | 2/1997 | Zheng et al. | 437/60 |
| 5,612,254 | 3/1997 | Mu et al. | 437/195 |
| 5,614,765 | 3/1997 | Avanzino et al. | 257/774 |
| 5,635,423 | 6/1997 | Huang et al. | 437/195 |
| 5,651,855 | 7/1997 | Dennison et al. | 156/636.1 |
| 5,686,354 | 11/1997 | Avanzino et al. | 437/190 |
| 5,705,430 | 1/1998 | Avanzino et al. | 437/195 |
| 5,985,753 | * 8/1998 | Yu | 438/637 |

FOREIGN PATENT DOCUMENTS

382785A * 8/1998 (TW) ............ H01L/21/768

* cited by examiner

*Primary Examiner*—Charles Bowers
*Assistant Examiner*—Nema Berezny
(74) *Attorney, Agent, or Firm*—George O. Saile; Stephen B. Ackerman; Stephen G. Stanton (57) ABSTRACT

A method for forming through a dielectric layer a trench contiguous with a via. There is first provided a substrate having a contact region formed therein. There is then formed upon the substrate a blanket first dielectric layer. There is then formed upon the blanket first dielectric layer a blanket etch stop layer. There is then formed upon the blanket etch stop layer a patterned first photoresist layer which defines a location of a via to be formed through the blanket etch stop layer and the blanket first dielectric layer to access the contact region. There is then etched while employing a first etch method the blanket etch stop layer to form a patterned etch stop layer. There is then also implanted into the blanket first dielectric layer at the location of the via to be formed through the blanket first dielectric layer a dose of a first implanting ion to form a selectively ion implanted blanket first dielectric layer having an ion implanted region which etches more rapidly within a second etch method than an adjoining non ion implanted region of the selectively ion implanted blanket first dielectric layer. There is then formed over the patterned etch stop layer and the selectively ion implanted blanket first dielectric layer a blanket second dielectric layer. There is then formed upon the blanket second dielectric layer a patterned second photoresist layer which defines a location of a trench to be formed through the blanket second dielectric layer, where the trench has an areal dimension greater than the via and at least partially overlapping the via. Finally, there is then etched while employing the second etch method the trench through the blanket second dielectric layer and the via through the selectively ion implanted blanket first dielectric layer. There may then be formed within the trench and the via a contiguous patterned conductor interconnect layer and patterned conductor stud layer employing a damascene method.

29 Claims, 3 Drawing Sheets

DUAL DAMASCENE PATTERNED CONDUCTOR LAYER FORMATION METHOD

CROSS-REFERENCE TO RELATED APPLICATION

This application is related to a co-assigned and co-invented application Ser. No. 09/225,380, filed Jan. 4, 1999 titled "Dual Damascene Patterned Conductor Layer Formation Method Without Etch Stop Layer," the teachings of which are incorporated herein fully by reference.

BACKGROUND OF THE INVENTION

1. Field of the Invention

The present invention relates generally to methods for forming patterned conductor layers separated by patterned dielectric layers within microelectronics fabrications. More particularly, the present invention relates to dual damascene methods for forming patterned conductor layers separated by patterned dielectric layers within microelectronics fabrications.

2. Description of the Related Art

Microelectronics fabrications are formed from microelectronics substrates over which are formed patterned microelectronics conductor layers which are separated by microelectronics dielectric layers.

As microelectronics integration levels have increased and microelectronics device and patterned conductor layer dimensions have decreased, it has become increasingly common within the art of microelectronics fabrication to employ interposed between the patterns of narrow linewidth dimension and/or narrow pitch dimension patterned microelectronics conductor interconnect layers within microelectronics fabrications microelectronics dielectric layers formed of low dielectric constant dielectric materials. Such patterned microelectronics conductor interconnect layers often access within the microelectronics fabrications within which they are formed patterned conductor contact stud layers or patterned conductor interconnect stud layers. For the purposes of the present disclosure, low dielectric constant dielectric materials are intended as dielectric materials having a dielectric constant of less than about 3.0. For comparison purposes, dielectric layers formed employing conventional silicon oxide dielectric materials, silicon nitride dielectric materials or silicon oxynitride dielectric materials typically have dielectric constants in the range of from about 4.0 to about 9.0.

Microelectronics dielectric layers formed of low dielectric constant dielectric materials are desirable interposed between the patterns of narrow linewidth dimension and/or narrow pitch dimension patterned microelectronics conductor layers within microelectronics fabrications since such dielectric layers formed from such low dielectric constant dielectric materials provide dielectric layers which assist in providing microelectronics fabrications exhibiting enhanced microelectronics fabrication speed, attenuated patterned microelectronics conductor layer parasitic capacitance, and attenuated patterned microelectronics conductor layer crosstalk.

Low dielectric constant dielectric materials which may be employed for forming low dielectric constant microelectronics dielectric layers within microelectronics fabrications are typically materials with hydrogen and/or carbon content, such as but not limited to organic polymer spin-on-polymer dielectric materials (such as but not limited to polyimide organic polymer spin-on-polymer dielectric materials, fluorinated polyimide organic polymer spin-on-polymer dielectric materials, poly-arylene-ether organic polymer spin-on-polymer dielectric materials and fluorinated poly-arylene-ether organic polymer spin-on-polymer dielectric materials), amorphous carbon dielectric materials (such as but not limited to amorphous carbon and fluorinated amorphous carbon), and silsesqiuoxane spin-on-glass (SOG) dielectric materials (such as but not limited to hydrogen silsesquioxane spin-on-glass (SOG) dielectric materials, carbon bonded hydrocarbon silsesquioxane spin-on-glass (SOG) dielectric materials, and carbon bonded fluorocarbon silsesquioxane spin- on-glass (SOG) dielectric materials).

While organic polymer spin-on-polymer dielectric materials, amorphous carbon dielectric materials, and silsesquioxane spin-on-glass (SOG) dielectric materials are thus desirable within the art of microelectronics fabrication for forming patterned low dielectric constant microelectronics dielectric layers interposed between the patterns of patterned conductor interconnect layers which access patterned conductor stud layers within microelectronics fabrications, such microelectronics fabrication structures are often not formed entirely without problems. In particular, such microelectronics fabrication structures are typically formed employing an etch stop layer formed interposed between: (1) a patterned first dielectric layer through which is formed a patterned conductor stud layer; and (2) a patterned low dielectric constant dielectric layer which is formed adjoining the patterned conductor interconnect layer which contacts the patterned conductor stud layer. The etch stop layer typically assures optimal definition of the patterned conductor interconnect layer within respect to the patterned conductor stud layer. Unfortunately, the presence of such etch stop layers often provides additional microelectronics fabrication complexity within microelectronics fabrications within which are formed patterned conductor interconnect layers which contact patterned conductor stud layers. Similarly, even with the presence of such etch stop layers, it is often difficult to form both patterned conductor interconnect layers and contiguous patterned conductor stud layers with enhanced linewidth control.

It is thus towards the goal of forming microelectronics fabrication structures comprising patterned low dielectric constant dielectric layers separating patterned conductor interconnect layers which in turn contact patterned conductor stud layers, with enhanced linewidth control, that the present invention is specifically directed. In a more general sense, the present invention is also directed towards forming within microelectronics fabrications patterned conductor interconnect layers contiguous with patterned conductor stud layers, with enhanced linewidth control, where neither the patterned conductor interconnect layers nor the patterned conductor stud layers are necessarily separated by low dielectric constant dielectric layers.

Various methods have been disclosed in the art of microelectronics fabrication for forming patterned microelectronics layers within microelectronics fabrications.

For example, several ion implant assisted methods have been disclosed within the art of microelectronics fabrication for forming patterned microelectronics layers within microelectronics fabrications. Examples of such methods are disclosed by: (1) Taylor et al., in U.S. Pat. No. 4,377,437 (ion implant method where ion implanted portions of a substrate layer react with a reactant within a reactant atmosphere to form a protective compound within the ion implanted portions of the substrate layer, which ion implanted portions are inhibited from further etching within the reactant atmosphere); (2) Taji et al., in U.S. Pat. No. 4,634,494 (ion implant method employing boron ions implanted into a phosphosilicate glass layer to selectively modify the etch properties of the boron doped phosphosilicate glass layer so formed); (3) Jain et al., in U.S. Pat. No. 4,652,334 (ion implant method which facilitates selective etching of ion implanted portions of a silicon oxide layer within an ammoniacal hydrogen peroxide etchant); (4) Reichert et al., in U.S. Pat. No. 4,863,556 (ion implant method which facilitates selective etching of ion implanted portions of a silicon oxide layer and an underlying silicon nitride layer within a phosphoric acid etchant); and (5) Tsuhchiaki, in U.S. Pat. No. 5,444,007 (ion implant method for simultaneously forming narrow trenches with straight sidewalls and wide trenches with tapered sidewall profiles within substrates).

In addition, Moslehi, in U.S. Pat. No. 5,460,693, discloses a fully dry microlithography method for forming a patterned processable layer within a microelectronics fabrication, where the fully dry microlithography method is predicated upon photosensitive properties of a halogen doped layer employed as a mask layer within the fully dry microlithography method.

Further, Cheung et al., in U.S. Pat. No. 5,550,405, discloses a lift off method employing a tri-layer resist layer for forming an interconnect structure employing a low resistance metal layer separated by a low dielectric constant dielectric layer within a microelectronics fabrication. Within the method, a low dielectric constant dielectric material employed within the low dielectric constant dielectric layer is employed as a diffusion barrier to diffusion of a low resistance metal employed within the low resistance metal layer.

Finally, there is also disclosed in the art several damascene and dual damascene methods for forming patterned conductor interconnect layers, optionally contiguous with patterned conductor stud layers, within microelectronics fabrications. Examples of such methods are disclosed by: (1) Fiordalice et al., U.S. Pat. No. 5,578,523 (damascene method employing an aluminum nitride polish assisting layer to attenuate dishing or cusping of a chemical mechanical polish (CMP) planarized conductor interconnect layer formed employing the damascene method); (2) Zheng et al., in U.S. Pat. No. 5,602,053 (dual damascene method incorporating an antifuse structure within a dual damascene structure); (3) Mu et al., in U.S. Pat. No. 5,612,254 (damascene method for forming a patterned conductor interconnect layer contacting a patterned conductor stud layer within a microelectronics fabrication); (4) Huang et al., in U.S. Pat. No. 5,635,423 (modified dual damascene method employing an etch stop layer interposed between a first dielectric layer through which is formed a patterned conductor stud layer and a second dielectric layer through which is formed a patterned conductor interconnect layer); (5) Dennison et al., in U.S. Pat. No. 5,651,855 (dual damascene method employing a single dielectric layer with two separate masking and etching process steps); (6) Avanzino et al., in U.S. Pat. No. 5,686,354 (dual damascene method employing a single dielectric layer and a conformal trench masking layer); (7) Avanzino et al., in U.S. Pat. No. 5,705,430 (dual damascene method employing two dielectric layers and sacrificial via fill layer); and (8) Avanzino et al., in U.S. Pat. No. 5,614,765 (a dual damascene method where a conductor stud layer is formed in a via formed in a self aligned fashion through a dielectric layer).

Desirable within the art of microelectronics fabrication are methods which may be employed to form within microelectronics fabrications patterned conductor interconnect layers contiguous with patterned conductor stud layers, with enhanced linewidth control. More particularly desirable in the art of microelectronics fabrication are methods which may be employed to form within microelectronics fabrications low dielectric constant dielectric layers interposed between the patterns of patterned conductor interconnect layers which in turn contact patterned conductor stud layers, with enhanced linewidth control.

It is towards the foregoing objects that the present invention is both generally and more specifically directed.

SUMMARY OF THE INVENTION

A first object of the present invention is to provide a method for forming within a microelectronics fabrication a patterned conductor interconnect layer contiguous with a patterned conductor stud layer.

A second object of the present invention is to provide a method in accord with the first object of the present invention, where the method provides for enhanced linewidth control.

A third object of the present invention is to provide a method in accord with the first object of the present invention or the second object of the present invention, where the microelectronics fabrication is a semiconductor integrated circuit microelectronics fabrication.

A fourth object of the present invention is to provide a method in accord with the first object of the present invention, the second object of the present invention or the third object of the present invention, which method is readily commercially implemented.

In accord with the objects of the present invention there is provided a method for forming through a dielectric layer a trench contiguous with a via. To practice the method of the present invention, there is first provided a substrate having a contact region formed therein. There is then formed upon the substrate a blanket first dielectric layer. There is then formed upon the blanket first dielectric layer a blanket etch stop layer. There is then formed upon the blanket etch stop layer a patterned first photoresist layer which defines a location of a via to be formed through the blanket etch stop layer and the blanket first dielectric layer to access the contact region. There is then etched while employing a first etch method the blanket etch stop layer to form a patterned etch stop layer. There is then also implanted into the blanket first dielectric layer at the location of the via to be formed through the blanket first dielectric layer a dose of a first implanting ion to form a selectively ion implanted blanket first dielectric layer having an ion implanted region of the selectively ion implanted blanket first dielectric layer which etches more rapidly within a second etch method than an adjoining non ion implanted region of the selectively ion implanted blanket first dielectric layer. There is then formed over the patterned etch stop layer and the selectively ion implanted blanket first dielectric layer a blanket second dielectric layer. There is then formed upon the blanket second dielectric layer a patterned second photoresist layer which defines the location of a trench to be formed through the blanket second dielectric layer, the trench having an areal dimension greater than the via and at least partially overlapping the areal dimension of the via. Finally, there is then sequentially etched while employing the second etch method the trench through the blanket second dielectric layer and the via through the ion selectively ion implanted blanket first dielectric layer.

There may then be formed into the trench and the via a patterned conductor interconnect layer contiguous with a patterned conductor stud layer while employing a damascene method.

The present invention provides a method for forming within a microelectronics fabrication a patterned conductor interconnect layer contiguous with a patterned conductor stud layer, where the method provides for enhanced linewidth control. The method of the present invention realizes the foregoing object by employing when forming within a pair of dielectric layers within which is formed a trench and a contiguous via into which is formed the patterned conductor interconnect layer contiguous with the patterned conductor stud layer an ion implanting of a portion of a blanket first dielectric layer through which is formed the via into which is subsequently formed the patterned conductor stud layer portion of the contiguous patterned conductor interconnect layer and patterned conductor stud layer. The ion implanting of the portion of the blanket first dielectric layer provides a selectively ion implanted portion of the blanket first dielectric layer which etches at a faster rate than an adjoining non ion implanted portion of the blanket first dielectric layer and thus provides enhanced linewidth control for the contiguous patterned conductor interconnect layer and patterned conductor stud layer when formed into the trench and contiguous via.

The present invention may be employed where the microelectronics fabrication is a semiconductor integrated circuit microelectronics fabrication. The present invention does not discriminate with respect to the nature of a microelectronics fabrication within which is formed a patterned conductor interconnect layer which in turn contacts a patterned conductor stud layer. Thus, although the method of the present invention may be employed when forming patterned conductor interconnect layers which in turn contact patterned conductor stud layers within semiconductor integrated circuit microelectronics fabrications, the method of the present invention may also be employed in forming patterned conductor interconnect layers which in turn contact patterned conductor stud layers within microelectronics fabrications including but not limited to semiconductor integrated circuit microelectronics fabrications, solar cell microelectronics fabrications, ceramic substrate microelectronics fabrications and flat panel display microelectronics fabrications.

The present invention is readily commercially implemented. The present invention employs methods and materials which are otherwise generally known in the art of microelectronics fabrication. Since it is a novel ordering and use of methods and materials which provides the method of the present invention, rather than the existence of the methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming through a dielectric layer within a microelectronics fabrication a patterned conductor interconnect layer contiguous with a patterned conductor stud layer, where the patterned conductor interconnect layer formed contiguous with the patterned conductor stud layer is formed with enhanced linewidth control. The method of the present invention realizes the foregoing object by employing when forming the patterned conductor interconnect layer contiguous with the patterned conductor stud layer an ion implanting of a portion of a blanket first dielectric layer through which is formed the patterned conductor stud layer portion of the patterned conductor interconnect layer contiguous with the patterned conductor stud layer such that the ion implanted portion of the selectively ion implanted blanket first dielectric layer etches more rapidly within an etch method employed for forming the via through the blanket first dielectric layer than an adjoining non ion implanted portion of the selectively ion implanted blanket first dielectric layer.

The present invention does not discriminate with respect to the nature of a microelectronics fabrication within which is formed a patterned conductor interconnect layer which in turn contacts a patterned conductor stud layer. Thus, although the method of the present invention may be employed when forming patterned conductor interconnect layers which in turn contact patterned conductor stud layers within semiconductor integrated circuit microelectronics fabrications, the method of the present invention may also be employed in forming patterned conductor interconnect layers which in turn contact patterned conductor stud layers within microelectronics fabrications including but not limited to semiconductor integrated circuit microelectronics fabrications, solar cell microelectronics fabrications, ceramic substrate microelectronics fabrications and flat panel display microelectronics fabrications.

Figure 1:
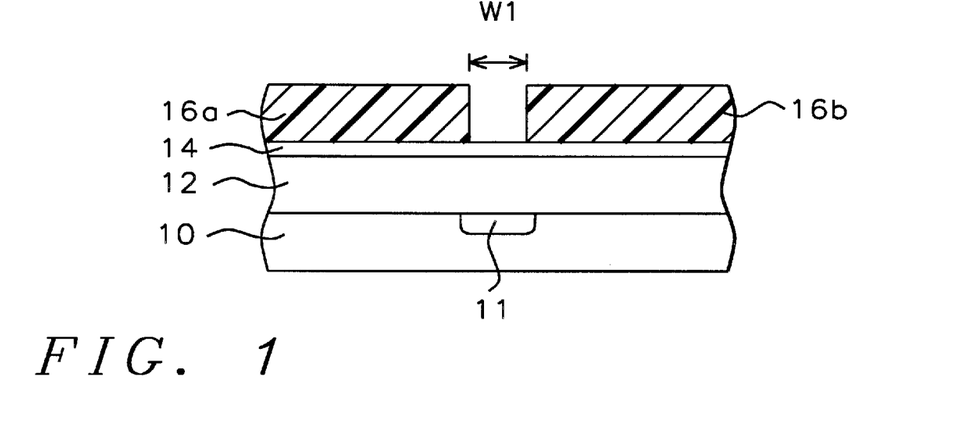
FIG. 1, FIG. 2, FIG. 3, FIG. 4, FIG. 5, FIG. 6, FIG. 7 and FIG. 8 show a series of schematic cross-sectional and schematic plan-view diagrams illustrating the results of forming within a microelectronics fabrication in accord with a preferred embodiment of the present invention a patterned conductor interconnect layer contiguous with a patterned conductor stud layer.

Referring now to FIG. 1 to FIG. 8, there is shown a series of schematic cross-sectional and schematic plan-view diagrams illustrating the results of forming within a microelectronics fabrication in accord with a preferred embodiment of the present invention a patterned conductor interconnect layer contiguous with a patterned conductor stud layer. Shown in FIG. 1 is a schematic cross-sectional diagram of the microelectronics fabrication at an early stage in its fabrication in accord with the present invention.

Shown in FIG. 1 is a substrate 10 employed within a microelectronics fabrication, where the substrate 10 has formed therein a contact regions 11. Within the preferred embodiment of the present invention, the substrate 10 may be a substrate employed within a microelectronics fabrication including but not limited to a semiconductor integrated circuit microelectronics fabrication, a solar cell microelectronics fabrication, a ceramic substrate microelectronics fabrication or a flat panel display microelectronics fabrication. Although not specifically illustrated within the schematic cross-sectional diagram of FIG. 1, the substrate 10 may be the substrate itself employed within the microelectronics fabrication, or in the alternative, the substrate 10 may be the substrate employed within the microelectronics fabrication, where the substrate may have any of several additional layers formed thereupon or thereover as are conventional within the microelectronics fabrication within which is employed the substrate. Such additional microelectronics layers may include, but are not limited to, microelectronics conductor layers, microelectronics semiconductor layers and microelectronics dielectric layers.

With respect to the contact region 11 formed within the substrate 10, the contact region 11 will typically be either a conductor contact region or a semiconductor contact region within the microelectronics fabrication within which is employed the substrate 10. More preferably, within the present invention when the substrate 10 is a semiconductor substrate alone employed within a semiconductor integrated circuit microelectronics fabrication, and the contact region 11 is a semiconductor substrate contact region which is typically employed when forming semiconductor integrated circuit devices employing the substrate 10.

Shown also within FIG. 1 formed upon the substrate 10 and covering the contact region 11 is a blanket first dielectric layer 12. Within the preferred embodiment of the present invention, the blanket first dielectric layer 12 may be formed from any of several dielectric materials as are known for forming dielectric layers within microelectronics fabrications. Such dielectric materials include but are not limited to conventional silicon containing dielectric materials such as but not limited to silicon oxide dielectric materials, silicon nitride dielectric materials and silicon oxynitride dielectric materials, as well as more advanced low dielectric constant dielectric materials such as organic polymer spin-on-polymer dielectric materials, amorphous carbon dielectric materials and silsesquioxane spin-on-glass (SOG) dielectric materials as are disclosed in greater detail within the Description of the Related Art. Typically and preferably, the blanket first dielectric layer 12 is formed to a thickness of from about 5000 to about 9000 angstroms.

There is also shown within FIG. 1 formed upon the blanket first dielectric layer 12 a blanket etch stop layer 14. Within the preferred embodiment of the present invention, the blanket etch stop layer 14 may be formed of any dielectric material which effectively serves as an etch stop material with respect to a material from which is formed the blanket first dielectric layer 12 and a material from which is formed a blanket second dielectric layer which is formed over the blanket first dielectric layer. Thus, although there may be several methods and materials which may be employed for forming the blanket etch stop layer 14, those methods and materials will typically and preferably be selected within the context of methods and materials employed for forming the blanket first dielectric layer 12 and the blanket second dielectric layer formed over the blanket etch stop layer 14 and the blanket first dielectric layer 12. Typically and preferably, the blanket etch stop layer 14 is formed to a thickness of from about 1000 to about 2000 angstroms.

Finally, there is shown within FIG. 1 formed upon the blanket etch stop layer 14 a pair of patterned first photoresist layers 16a and 16b. Within the preferred embodiment of the present invention, the patterned first photoresist layers 16a and 16b may be formed from any of several photoresist materials as are known in the art of microelectronics fabrication, including photoresist materials selected from the general groups of photoresist materials including but not limited to positive photoresist materials and negative photoresist materials. Preferably, each of the patterned first photoresist layers 16a and 16b is formed to a thickness of from about 8000 to about 12000 angstroms to define an aperture of width W1 of from about 0.2 to about 0.5 microns which defines a location of a via to be formed through the blanket etch stop layer 14 and the blanket first dielectric layer 12 accessing the contact region 11 within the substrate 10.

Figure 2:
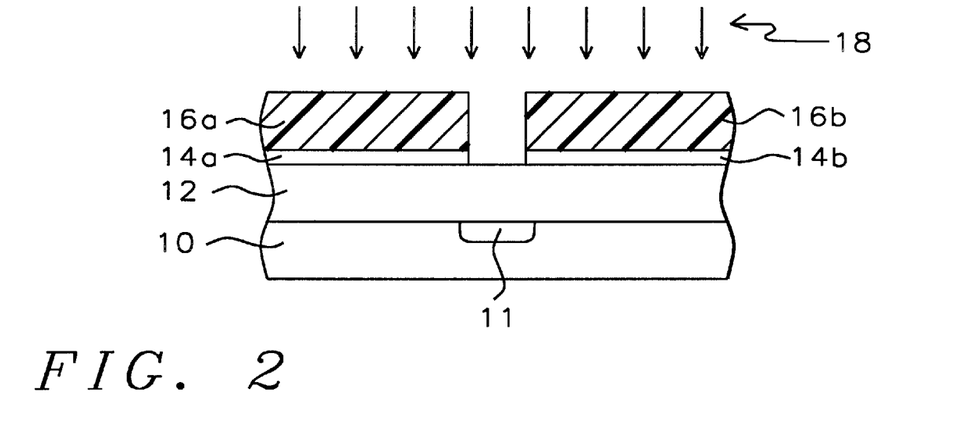

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the blanket etch stop layer 14 has been patterned to form the patterned etch stop layers 14a and 14b while employing a first etching plasma 18. Within the preferred embodiment of the present invention, the first etching plasma 18 employs an etchant gas composition which upon plasma activation provides an enchant species which etches the blanket etch stop layer 14 to form the patterned etch stop layers 14a and 14b. When the blanket etch stop layer 14 is formed of an etch stop material such as a silicon nitride material or a silicon oxynitride material, the first etching plasma 18 will typically and preferably employ a fluorine containing, such as a fluorocarbon containing, etchant gas composition.

Figure 3:
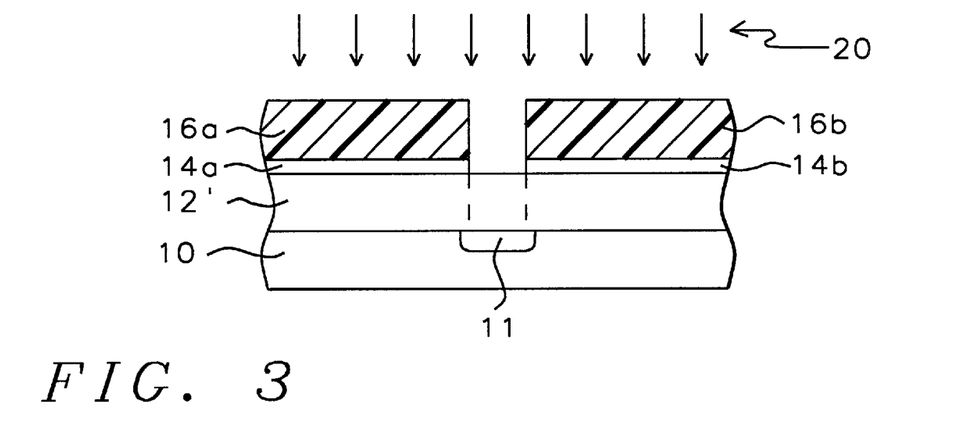

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein the blanket first dielectric layer 12 has been selectively and orthogonally ion implanted with a first ion implant treatment 20 while employing the patterned photoresist layers 16a and 16b as a mask to form a selectively ion implanted blanket first dielectric layer 12' having an ion implanted region through which is subsequently formed a via accessing the contact region 11. Within the preferred embodiment of the present invention, the ion implanted region of the selectively ion implanted blanket first dielectric layer 12' has an enhanced etch rate within an etch method employed for forming the via through the selectively ion implanted blanket first dielectric layer 12' than an adjoining non ion implanted region of the selectively ion implanted blanket first dielectric layer 12'.

Within the preferred embodiment of the present invention, the first ion implant treatment 20 may employ implanting ions selected from any of several types of implanting ions are known in the art of microelectronics fabrication, including electrically active dopant implanting ions, such as but not limited to boron ions, boron difluoride ions, phosphorus ions and arsenic ions, as well as electrically inactive dopant implanting ions, such as but not limited to argon ions and xenon ions. Within the preferred embodiment of the present invention, the implanting ions are provided at: (1) an ion implantation dose which provides optimal etch rate differences between the ion implanted portion and the adjoining non ion implanted portions of the selectively ion implanted blanket first dielectric layer 12'; and (2) an ion implantation energy which preferably provides a peak implanted ion concentration centered within the thickness of the selectively ion implanted blanket second dielectric layer 12'. Within the preferred embodiment of the present invention when employing comparatively heavier electrically active dopant ions such as boron difluoride, phosphorus and arsenic as are common in the art of microelectronics fabrication, the first ion implant treatment 20 will typically and preferably employs an ion implant dose of from about 1E15 to about 1E16 ions per square centimeter and an ion implantation energy of from about 30 to about 200 kev.

Although not specifically illustrated within the schematic cross-sectional diagrams of FIG. 2 and FIG. 3, it is also feasible and in some instances preferred within the preferred embodiment of the present invention that the blanket etch stop layer 14 is patterned to form the patterned etch stop layers 14a and 14b after the blanket first dielectric layer 12 is ion implanted within the first ion implant treatment 20 to form the selectively ion implanted blanket first dielectric layer 12'. Under such circumstances, a more uniform implanted ion profile within the ion implanted region of the selectively ion implanted blanket first dielectric layer 12' may be obtained.

Figure 4:
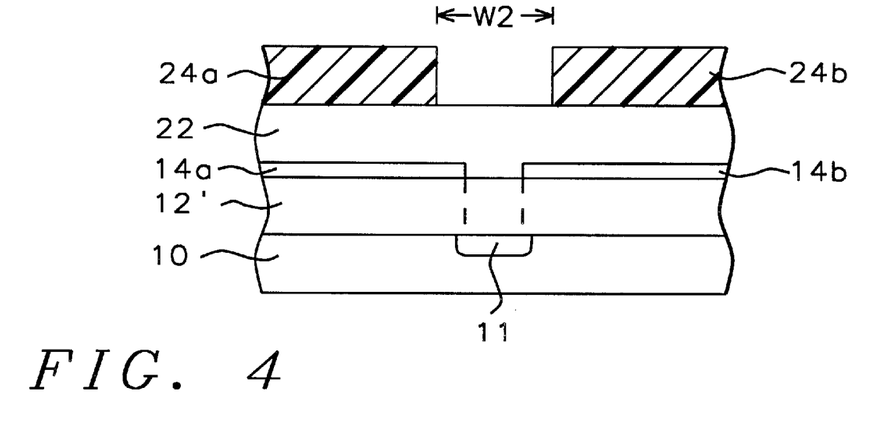

Referring now to FIG. 4, there is shown a schematic cross-sectional diagram illustrating the results of further processing of the microelectronics fabrication whose schematic cross-sectional diagram is illustrated in FIG. 3. Shown in FIG. 4 is a schematic cross-sectional diagram of a microelectronics fabrication otherwise equivalent to the microelectronics fabrication whose schematic cross-sectional diagram is illustrated in FIG. 3, but wherein: (1) the patterned first photoresist layers 16a and 16b have been stripped from the microelectronics fabrication; and (2) there is then formed upon the patterned etch stop layers 14a and 14b and the ion implanted region of the selectively ion implanted blanket first dielectric layer 12' a blanket second dielectric layer 22 having formed thereupon a pair of patterned second photoresist layers 24a and 24b.

Within the preferred embodiment of the present invention, the patterned first photoresist layers 16a and 16b may be stripped from the microelectronics fabrication whose schematic cross-sectional diagram is illustrated in FIG. 3 to provide in part the microelectronics fabrication whose schematic cross-sectional diagram is illustrated in FIG. 4 employing methods as are conventional in the art of microelectronics fabrication. Such methods typically include, but are not limited to wet chemical stripping methods employing suitable solvents and dry oxygen containing plasma stripping methods.

Within the preferred embodiment of the present invention with respect to the blanket second dielectric layer 22, the blanket second dielectric layer 22 may be formed employing methods and materials analogous or equivalent to the methods and materials employed for forming the blanket first dielectric layer 12 as illustrated within the schematic cross-sectional diagram of FIG. 1. Although not required within the method of the present invention, the blanket second dielectric layer 22 is preferably formed of the same dielectric material which is employed for forming the blanket first dielectric layer 12, or at least of a dielectric material which, similarly with the blanket first dielectric layer 12, etches more rapidly within a plasma which is employed in forming a via through the blanket first dielectric layer 12 that the material from which is formed the patterned etch stop layers 14a and 14b. Typically and preferably, the blanket second dielectric layer 22 is formed to a thickness of from about 3000 to about 7000 angstroms.

Typically and preferably within the method of the present invention, the patterned etch stop layers 14a and 14b are formed of a silicon nitride or a silicon oxynitride etch stop material, while both of the blanket first dielectric layer 12 and the blanket second dielectric layer are formed from a single dielectric material selected from the group consisting of silicon oxide dielectric materials, silsesquioxane spin-on-glass (SOG) dielectric materials, amorphous carbon dielectric materials and organic polymer spin-on-polymer dielectric materials. When both the blanket first dielectric layer 12 and the blanket second dielectric layer 22 are both formed of a silicon oxide dielectric material or a silsesquioxane spin-on-glass (SOG) dielectric material, the patterned etch stop layers 14a and 14b are typically and preferably formed employing methods, such as plasma enhanced chemical vapor deposition (PECVD) methods, which provide the patterned etch stop layers 14a and 14b of enhanced density such the patterned etch stop layers 14a and 14b serve as effective etch stop layers with respect to the blanket second dielectric layer 22 and the selectively ion implanted blanket first dielectric layer 12' when employing a fluorine containing plasma for etching the blanket second dielectric layer 22 and the selectively ion implanted blanket first dielectric layer 12'. When both the blanket second dielectric layer 22 and the blanket first dielectric layer 12 are formed of an oxygen containing plasma etchable material such as an amorphous carbon dielectric material or an organic polymer spin-on-polymer dielectric material, there is typically observed limited etching of the patterned etch stop layers 14a and 14b within the oxygen containing plasma, but it is then typically desirable within the method of the present invention to employ a patterned hard mask layer formed of a hard mask material such as but not limited to a silicon oxide hard mask material, silicon nitride hard mask material or a silicon oxynitride hard mask material interposed between the blanket second dielectric layer 22 and the patterned second photoresist layers 24a and 24b. Under such circumstances, the patterned hard mask layer so formed is formed to a thickness of from about 500 to about 2000 angstroms.

Within the preferred embodiment of the present invention with respect to the patterned second photoresist layers 24a and 24b, the patterned second photoresist layers 24a and 24b are preferably formed employing methods and materials analogous or equivalent to the methods and materials employed when forming the patterned first photoresist layers 16a and 16b, as illustrated within the schematic cross-sectional diagram of FIG. 1, with the exception that the patterned second photoresist layers 24a and 24b define a trench of width W2, where the trench has an areal dimension greater than the areal dimension of the via defined by the patterned first photoresist layers 16a and 16b, and where the areal dimension of the via is preferably contained completely within the areal dimension of the trench.

Figure 5:
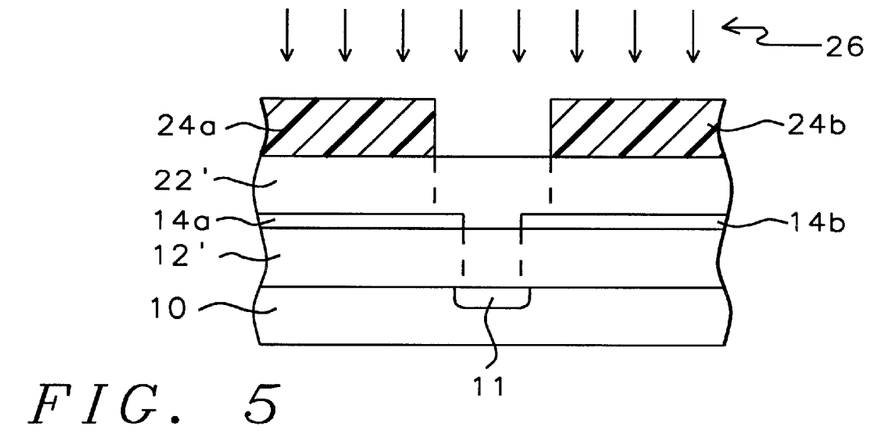

Referring now to FIG. 5, there is shown a schematic cross-sectional diagram illustrating the results of further processing of the microelectronics fabrication whose schematic cross-sectional diagram is illustrated in FIG. 4. Shown in FIG. 5 is a schematic cross-sectional diagram of a microelectronics fabrication otherwise equivalent to the microelectronics fabrication whose schematic cross-sectional diagram is illustrated in FIG. 4, but wherein the blanket second dielectric layer 22 has been ion implanted with a second ion implant treatment 26 while employing the patterned second photoresist layers 24a and 24b as a mask layer to form a selectively ion implanted blanket second dielectric layer 22' having an ion implanted region corresponding with the trench defined by the pair of patterned second photoresist layers 24a and 24b. Within the preferred embodiment of the present invention, the second ion implant treatment 26 of the blanket second dielectric layer 22 is optional, although it is preferred. Similarly with the selectively ion implanted blanket first dielectric layer 12', the ion implanted region of the selectively ion implanted blanket second dielectric layer 22' has a enhanced etch rate within a plasma etch method employed in forming a trench within the selectively ion implanted blanket second dielectric layer 22' in comparison with non ion implanted regions of the selectively ion implanted blanket second dielectric layer 22'.

Also similarly with the first ion implant treatment 20, the second ion implant treatment 26 may employ implanting ions analogous or equivalent to the implanting ions employed within the first ion implant treatment 20, while also employing an ion implant dose and an ion implant energy analogous or equivalent to the ion implant dose and the ion implant energy employed within the first ion implant treatment 20. Preferably, and similarly with the first ion implant treatment 20, the second ion implant treatment 26 provides a peak implanted ion concentration centered within the thickness of the selectively ion implanted blanket second dielectric layer 22'.

Figure 6:
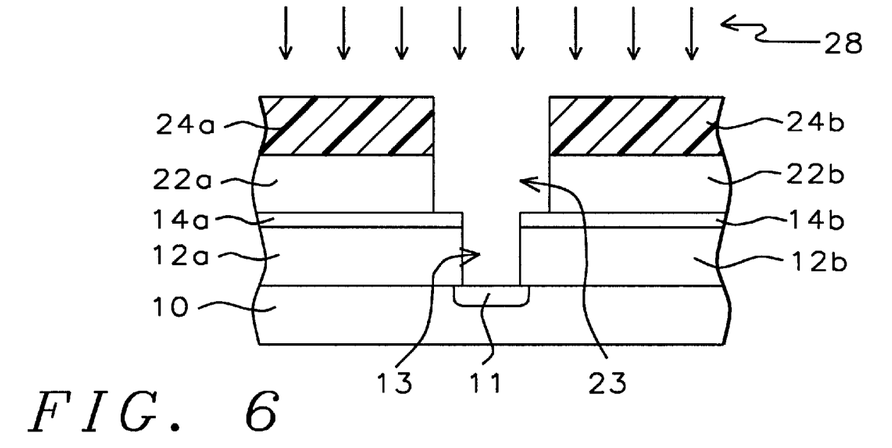

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram is illustrated in FIG. 5, but wherein a trench 23 is etched through the selectively ion implanted blanket second dielectric layer 22' to form a pair of patterned second dielectric layers 22a and 22b and a via 13 is etched through the selectively ion implanted blanket first dielectric layer 12' to form a pair of patterned first dielectric layers 12a and 12b while employing the pair of patterned second photoresist layers 24a and 24b as a photoresist etch mask layer and the pair of patterned etch stop layers 14a and 14b as etch stop layers, in conjunction with a second etching plasma 28. Within the preferred embodiment of the present invention, the second etching plasma 28 employs an etchant gas composition which upon plasma activation provides an etchant species which effectively etches sequentially the ion implanted region of the selectively ion implanted blanket second dielectric layer 22' and then the ion implanted region of the selectively ion implanted blanket first dielectric layer 12'. As noted above for a blanket second dielectric layer 22 and a blanket first dielectric layer 12 formed of a silicon oxide dielectric material or a silsesquioxane spin-on-glass (SOG) dielectric material, the second etching plasma 28 will typically and preferably employ an etchant gas composition which upon plasma activation forms a fluorine containing etchant species, while for a blanket second dielectric layer 22 and a blanket first dielectric layer 12 formed of an amorphous carbon dielectric material or an organic polymer spin-on-polymer dielectric material the second etching plasma 28 preferably employs an etchant gas composition which upon plasma activation forms an oxygen containing etchant species.

As similarly noted above, when employing an etchant gas composition which upon plasma activation forms an oxygen containing etchant gas species, it may be desirable to employ interposed between the selectively ion implanted blanket second dielectric layer 22' and the pair of patterned second photoresist layers 24a and 24b a patterned hard mask layer since it may be unavoidable that the pair of patterned second photoresist layers 24 and 24b are etched simultaneously with the selectively ion implanted blanket second dielectric layer 22' and the selectively ion implanted blanket first dielectric layer 12'. Similarly, it is thus also desirable when a patterned hard mask is employed to then select a thickness of the patterned second photoresist layers 24a and 24b such that they are completely stripped from the patterned hard mask layer while simultaneously etching the selectively ion implanted blanket second dielectric layer 22' to form the patterned second dielectric layers 22a and 22b and the selectively ion implanted blanket first dielectric layer 12' to form the patterned first dielectric layers 12a and 12b.

Upon forming the microelectronics fabrication whose schematic cross-sectional diagram is illustrated in FIG. 6, both the trench 23 defined by the patterned second dielectric layers 22a and 22b and the via 13 defined in part by the patterned first dielectric layers 12a and 12b are formed with enhanced linewidth control since corresponding ion implanted portions of the selectively ion implanted blanket second dielectric layer 22' and the selectively ion implanted blanket first dielectric layer 12' are etched within the second etching plasma 28 more rapidly than adjoining non ion implanted portions of the selectively ion implanted patterned second dielectric layer 22' and the selectively ion implanted blanket first dielectric layer 12'.

Figure 7:
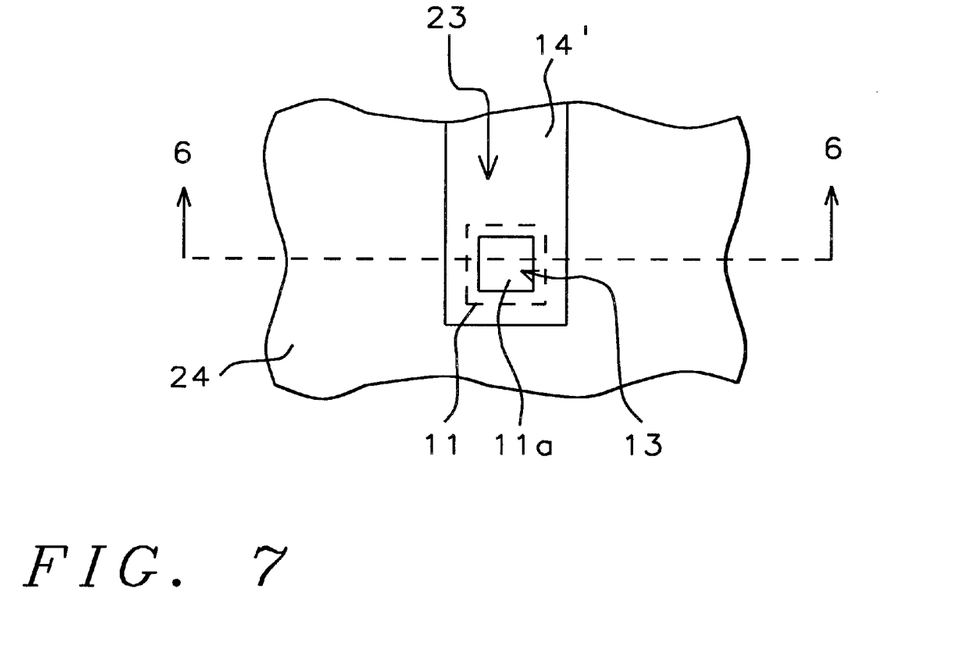

Referring now to FIG. 7, there is shown a schematic plan-view diagram corresponding with the microelectronics fabrication whose schematic cross-sectional diagram is illustrated in FIG. 6. As is illustrated within FIG. 7, there is shown the patterned photoresist layer 24 defining the trench 23 having as its floor the patterned etch stop layer 14', where the patterned etch stop layer 14' has formed therein the via 13 accessing an exposed portion 11a of the contact region 11. The outline of the contact region 11 is also shown.

Figure 8:
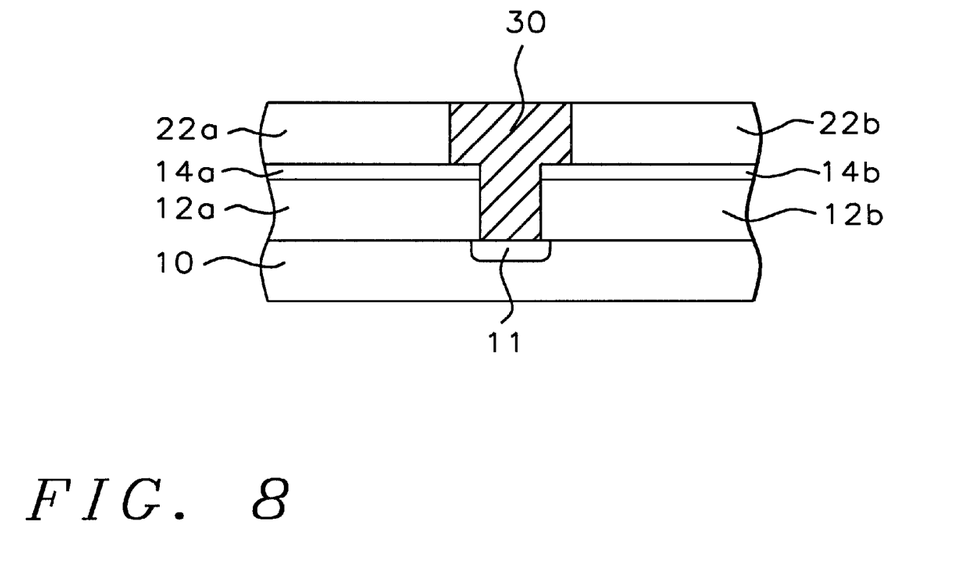

Referring now to FIG. 8, there is shown a schematic cross-sectional diagram illustrating the results of further processing of the microelectronics fabrication whose schematic cross-sectional diagram is illustrated in FIG. 7. Shown in FIG. 8 is a schematic cross-sectional diagram of a microelectronics fabrication otherwise equivalent to the microelectronics fabrication whose schematic cross-sectional diagram is illustrated within FIG. 6, but wherein: (1) the patterned second photoresist layers 24a and 24b have been stripped from the microelectronics fabrication; and (2) there is formed within the trench 23 and the via 13 a contiguous patterned conductor interconnect layer and patterned conductor stud layer 30.

To form the microelectronics fabrication whose schematic cross-sectional diagram is illustrated in FIG. 8 from the microelectronics fabrication whose schematic cross-sectional diagram is illustrated in FIG. 6, the patterned photoresist layers 24a and 24b are stripped employing methods and materials analogous or equivalent to the methods and materials employed in stripping from the microelectronics fabrication whose schematic cross-sectional diagram is illustrated in FIG. 3 the patterned first photoresist layers 16a and 16b to provide in part the microelectronics fabrication whose schematic cross-sectional diagram is illustrated in FIG. 4.

In addition, the contiguous patterned conductor interconnect layer and patterned conductor stud layer 30 is preferably formed employing a damascene method employing a polish planarizing of a of a blanket conductor layer formed upon the microelectronics fabrication from whose surface has been stripped the patterned second photoresist layers 24a and 24b. The contiguous patterned conductor interconnect layer and patterned conductor stud layer 30 may be formed of conductor materials as are known in the art of microelectronics fabrication, including but not limited to metal, metal alloy, doped polysilicon and polycide (doped polysilicon/metal silicide stack) conductor materials.

Upon forming the microelectronics fabrication whose schematic cross-sectional diagram is illustrated in FIG. 8 there is formed a microelectronics fabrication having formed therein a contiguous patterned conductor interconnect layer and patterned conductor stud layer with enhanced linewidth control since a trench and contiguous via into which is formed the contiguous patterned conductor interconnect layer and patterned conductor stud layer is formed with enhanced linewidth control.

EXAMPLES

There was obtained a series of semiconductor substrates and formed via spin coating and thermally curing at a temperature of about 400 degrees centigrade upon each semiconductor substrate within the series of semiconductor substrates a dielectric layer formed of a fluorinated poly-arylene-ether dielectric material available from Allied-Signal Co. as FLARE™ 2.0 dielectric material. Each of the dielectric layers was formed to a thickness of about 8000 angstroms.

Similarly, there was also obtained a second series of semiconductor substrates and formed upon each semiconductor substrate within the second series of semiconductor substrates a silicon oxide dielectric layer formed employing a plasma enhanced chemical vapor deposition (PECVD) method in turn employing tetraethylorthosilicate (TEOS) as a silicon source material. The plasma enhanced chemical vapor deposition (PECVD) method also employed: (1) a reactor chamber pressure of about 10 torr; (2) a radio frequency power of about 500 watts at a radio frequency of 13.56 MHZ; (3) a tetraethylorthosilicate flow rate of about 500 standard cubic centimeters per minute (sccm) in a helium carrier gas flow rate of about 300 standard cubic centimeters per minute (sccm); and (4) an oxygen (O2) oxidant at a flow rate of about 500 standard cubic centimeters per minute (sccm). Each of the silicon oxide dielectric layers was formed to a thickness of about 5000 angstroms.

Each of the fluorinated poly-arylene-ether dielectric layers and the silicon oxide dielectric layers was then ion implanted with a dopant ion under conditions as outlined within Table I. The ion implanted fluorinated poly-arylene-ether dielectric layers and the ion implanted silicon oxide dielectric layers were then etched within an oxygen and argon plasma which employed: (1) a reactor chamber pressure of about 30 torr; (2) a radio frequency power of about 500 watts at a source radio frequency of 13.56 MHZ; (3) a bias sputtering power of about 200 watts; (4) an oxygen flow rate of about 30 standard cubic centimeters per minute (sccm); and (5) an argon flow rate of about 20 standard cubic centimeters per minute (sccm).

There was then measured the amounts etched of the ion implanted fluorinated poly-arylene-ether dielectric layers and the ion implanted silicon oxide dielectric layers while employing methods as are conventional in the art of microelectronics fabrication. Finally, there was also calculated therefrom etch rates for the ion implanted fluorinated poly-arylene-ether dielectric layers and ion implanted silicon oxide dielectric layers within the oxygen and argon plasma. For comparison purposes, a non ion implanted fluorinated poly-arylene-ether dielectric layer and a non ion implanted silicon oxide dielectric layer were similarly etched and their etch rates are also reported in Table I.

TABLE 1

| Example | Dielectric | Ion Implant Conditions (dopant/energy/dose) | Etch Rate (A/min) |
| --- | --- | --- | --- |
| 1 | FLARE ™ | P/460kev/1E13 (twice) | 3820 +/− 20 |
| 2 | FLARE ™ | B/30kev/1.5E13 (twice) | 3960 +/− 20 |
| 3 | FLARE ™ | As/20kev/5E14 | 3900 +/− 20 |
| 4 | FLARE ™ | P/80kev/1.5E13 (twice) | 4160 +/− 20 |
| 5 | FLARE ™ | As/40kev/5.5E15 | 3760 +/− 20 |
| 6 | FLARE ™ | BF2/30kev/5.5E15 | 3780 +/− 20 |
| 7 | FLARE ™ | No I/I | 3800 +/− 20 |
| 8 | Si Oxide | P/460kev/1E13 (twice) | 120 +/− 2 |
| 9 | Si Oxide | B/30kev/1.5E13 (twice) | 120 +/− 2 |
| 10 | Si Oxide | As/40kev/5.5E15 | 160 +/− 2 |
| 11 | Si Oxide | No I/I | 120 +/− 2 |

As is seen from review of the data within Table I, there is observed under certain ion implant conditions significant increases of etch rate of ion implanted fluorinated poly-arylene-ether layers and ion implanted silicon oxide layers in comparison with non ion implanted fluorinated poly-arylene-ether layers and non ion implanted silicon oxide layers, such that the objects of the present invention with respect to forming dual damascene patterned conductor layers with enhanced linewidth control may be met.

As is understood by a person skilled in the art, the preferred embodiment and examples of the present invention are illustrative of the present invention rather than limiting of the present invention. Revisions and modifications may be made to methods, materials, structures, and dimensions through which may be formed microelectronics fabrications in accord with the preferred embodiment and examples of the present invention while still providing microelectronics fabrications formed in accord with the present invention, as defined by the appended claims.

What is claimed is:

1. A method for forming through a dielectric layer a trench contiguous with a via comprising:

providing a substrate having a contact region formed therein;

forming upon the substrate a blanket first dielectric layer;

forming upon the blanket first dielectric layer a blanket etch stop layer; the etch stop layer having a thickness of from about 1000 to 2000 Å;

forming upon the blanket etch stop layer a patterned first photoresist layer which defines a location of a via to be formed through the blanket etch stop layer and the blanket first dielectric layer to access the contact region;

etching while employing a first etch method the blanket etch stop layer to form a patterned etch stop layer;

implanting into the blanket first dielectric layer at the location of the via to be formed through the blanket first dielectric layer a dose of a first implanting ion to form a selectively ion implanted blanket first dielectric layer having an ion implanted region which etches more rapidly within a second etch method than an adjoining non ion implanted region of the selectively ion implanted blanket first dielectric layer;

forming over the patterned etch stop layer and the selectively ion implanted blanket first dielectric layer a blanket second dielectric layer;

forming upon the blanket second dielectric layer a patterned second photoresist layer which defines a location of a trench to be formed through the blanket second dielectric layer, the trench having an areal dimension greater than the via and at least partially overlapping the via; and etching while employing the second etch method the trench through the blanket second dielectric layer and the via through the selectively ion implanted blanket first dielectric layer, the second etch method employing a second etching plasma having an etchant gas composition which, upon plasma activation, provides an etchant species which effectively etches sequentially the defined trench region of the blanket second dielectric layer and then the ion implanted region of the selectively ion implanted blanket first dielectric layer.

2. The method of claim 1 wherein by ion implanting the blanket first dielectric layer to form the selectively ion implanted blanket first dielectric layer the via is formed with enhanced linewidth control.

3. The method of claim 1 wherein the substrate is employed within a microelectronics fabrication selected from the group consisting of semiconductor integrated circuit microelectronics fabrications, solar cell microelectronics fabrications, ceramic substrate microelectronics fabrications and flat panel display microelectronics fabrications.

4. The method of claim 1 wherein:
the blanket first dielectric layer and the blanket second dielectric layer are both formed from a first dielectric material selected from the group consisting of silicon oxide dielectric materials, silsesquioxane spin-on-glass (SOG) dielectric materials, organic polymer spin-on-polymer dielectric materials and amorphous carbon dielectric materials; and
the blanket etch stop layer is formed from a second dielectric material selected from the group consisting of silicon nitride dielectric materials and silicon oxynitride dielectric materials.

5. The method of claim 1 wherein the blanket etch stop layer is etched to form the patterned etch stop layer prior to ion implanting the blanket first dielectric layer to form the selectively ion implanted blanket first dielectric layer.

6. The method of claim 1 wherein the blanket etch stop layer is etched to form the patterned etch stop layer after ion implanting the blanket first dielectric layer to form the selectively ion implanted blanket first dielectric layer.

7. The method of claim 1 further comprising forming into the trench and the via a contiguous patterned conductor interconnect layer and patterned conductor stud layer while employing a damascene method.

8. A method for forming through a dielectric layer a trench contiguous with a via comprising:
providing a substrate having a contact region formed therein;
forming upon the substrate a blanket first dielectric layer;
forming upon the blanket first dielectric layer a blanket etch stop layer; the etch stop layer having a thickness of from about 1000 to 2000 Å;
forming upon the blanket etch stop layer a patterned first photoresist layer which defines a location of a via to be formed through the blanket etch stop layer and the blanket first dielectric layer to access the contact region;
etching while employing a first etch method the blanket etch stop layer to form a patterned etch stop layer;
implanting into the blanket first dielectric layer at the location of the via to be formed through the blanket first dielectric layer a dose of a first implanting ion to form a selectively ion implanted blanket first dielectric layer having an ion implanted region which etches more rapidly within a second etch method than an adjoining non ion implanted region of the selectively ion implanted blanket first dielectric layer;
forming over the patterned etch stop layer and the selectively ion implanted blanket first dielectric layer a blanket second dielectric layer;
forming upon the blanket second dielectric layer a patterned second photoresist layer which defines a location of a trench to be formed through the blanket second dielectric layer, the trench having an areal dimension greater than the via and at least partially overlapping the via;
implanting into the blanket second dielectric layer at the location of the trench to be formed through the blanket second dielectric layer a dose of a second implanting ion to form a selectively ion implanted blanket second dielectric layer having an ion implanted region which etches more rapidly within the second etch method than an adjoining non ion implanted region of the selectively ion implanted blanket second dielectric layer; and
etching while employing the second etch method the trench through the selectively ion implanted blanket second dielectric layer and the via through the selectively ion implanted blanket first dielectric layer, the second etch method employing a second etching plasma having an etchant gas composition which, upon plasma activation, provides an etchant species which effectively etches sequentially the ion implanted region of the selectively ion implanted blanket second dielectric layer and then the ion implanted region of the selectively ion implanted blanket first dielectric layer.

9. The method of claim 8 wherein by ion implanting the blanket first dielectric layer to form the selectively ion implanted blanket first dielectric layer the via is formed with enhanced linewidth control and by ion implanting the blanket second dielectric layer to form the selectively ion implanted blanket second dielectric layer the trench is formed with enhanced linewidth control.

10. The method of claim 8 wherein the substrate is employed within a microelectronics fabrication selected from the group consisting of semiconductor integrated circuit microelectronics fabrications, solar cell microelectronics fabrications, ceramic substrate microelectronics fabrications and flat panel display microelectronics fabrications.

11. The method of claim 8 wherein:
the blanket first dielectric layer and the blanket second dielectric layer are both formed from a first dielectric material selected from the group consisting of silicon oxide dielectric materials, silsesquioxane spin-on-glass (SOG) dielectric materials, organic polymer spin-on-polymer dielectric materials and amorphous carbon dielectric materials; and
the blanket etch stop layer is formed from a second dielectric material selected from the group consisting of silicon nitride dielectric materials and silicon oxynitride dielectric materials.

12. The method of claim 8 wherein the blanket etch stop layer is etched to form the patterned etch stop layer prior to ion implanting the blanket first dielectric layer to form the selectively ion implanted blanket first dielectric layer.

13. The method of claim 8 wherein the blanket etch stop layer is etched to form the patterned etch stop layer after ion implanting the blanket first dielectric layer to form the selectively ion implanted blanket first dielectric layer.

14. The method of claim 8 further comprising forming into the trench and the via a contiguous patterned conductor interconnect layer and patterned conductor stud layer while employing a damascene method.

15. The method of claim 1, wherein the blanket first dielectric layer and the blanket second dielectric layer are both formed from a dielectric material selected from the group consisting of silicon oxide dielectric material and FLARE 2.0.

16. The method of claim 15, wherein the second etch method employs an oxygen and argon plasma within an reactor chamber having a pressure of about 30 torr, a radio frequency power of about 500 watts at a source radio frequency of 13.56 MHz, a bias sputtering power of about 200 watts, an oxygen flow rate of about 30 sccm, and an argon flow rate of about 20 sccm.

17. The method of claim 1, wherein the first ion implantation employs ions selected from the group comprising boron ions, boron di-fluoride ions, argon ions, and xenon ions.

18. The method of claim 1, wherein the dose of the first implanting ion is from about 1E15 to 1E16 at an ion implantation energy of from about 30 to 200 keV.

19. The method of claim 1, wherein the blanket etch stop layer has a thickness of about 1000 Angstroms.

20. The method of claim 8, wherein the blanket first dielectric layer and the blanket second dielectric layer are both formed from a dielectric material selected from the group consisting of silicon oxide dielectric material and FLARE 2.0.

21. The method of claim 20, wherein the second etch method employs an oxygen and argon plasma within an reactor chamber having a pressure of about 30 torr, a radio frequency power of about 500 watts at a source radio frequency of 13.56 MHz, a bias sputtering power of about 200 watts, an oxygen flow rate of about 30 sccm, and an argon flow rate of about 20 sccm.

22. The method of claim 8, wherein the first and second ion implantation employs ions selected from the group comprising boron ions, boron di-fluoride ions, argon ions, and xenon ions.

23. The method of claim 8, wherein the dose of the first implanting ion is from about 1E15 to 1E16 at an ion implantation energy of from about 30 to 200 keV, and the dose of the second implanting ion is from about 1E15 to 1E16 at an ion implantation energy of from about 30 to 200 keV.

24. The method of claim 8, wherein the blanket etch stop layer has a thickness of about 1000 Angstroms.

25. A method for forming through a dielectric layer a trench contiguous with a via comprising:

providing a substrate having a contact region formed therein;

forming upon the substrate a blanket first dielectric layer; the blanket first dielectric layer formed from a dielectric material selected from the group consisting of silicon oxide dielectric material and FLARE 2.0;

forming upon the blanket first dielectric layer a blanket etch stop layer; the etch stop layer having a thickness of from about 1000 to 2000 Å;

forming upon the blanket etch stop layer a patterned first photoresist layer which defines a location of a via to be formed through the blanket etch stop layer and the blanket first dielectric layer to access the contact region;

etching while employing a first etch method the blanket etch stop layer to form a patterned etch stop layer;

implanting into the blanket first dielectric layer at the location of the via to be formed through the blanket first dielectric layer a dose of a first implanting ion to form a selectively ion implanted blanket first dielectric layer having an ion implanted region which etches more rapidly within a second etch method than an adjoining non ion implanted region of the selectively ion implanted blanket first dielectric layer; the second etch method including an oxygen and argon plasma;

forming over the patterned etch stop layer and the selectively ion implanted blanket first dielectric layer a blanket second dielectric layer; the blanket second dielectric layer formed from a dielectric material selected from the group consisting of silicon oxide dielectric material and FLARE 2.0;

forming upon the blanket second dielectric layer a patterned second photoresist layer which defines a location of a trench to be formed through the blanket second dielectric layer, the trench having an areal dimension greater than the via and at least partially overlapping the via;

implanting into the blanket second dielectric layer at the location of the trench to be formed through the blanket second dielectric layer a dose of a second implanting ion to form a selectively ion implanted blanket second dielectric layer having an ion implanted region which etches more rapidly within the second etch method than an adjoining non ion implanted region of the selectively ion implanted blanket second dielectric layer; and etching while employing the second etch method the trench through the selectively ion implanted blanket second dielectric layer and the via through the selectively ion implanted blanket first dielectric layer, the second etch method employing a second etching plasma having an etchant gas composition which, upon plasma activation, provides an etchant species which effectively etches sequentially the ion implanted region of the selectively ion implanted blanket second dielectric layer and then the ion implanted region of the selectively ion implanted blanket first dielectric layer.

26. The method of claim 25, wherein the second etch method is conducted within an reactor chamber having a pressure of about 30 torr, a radio frequency power of about 500 watts at a source radio frequency of 13.56 MHz, a bias sputtering power of about 200 watts, an oxygen flow rate of about 30 sccm, and an argon flow rate of about 20 sccm.

27. The method of claim 25, wherein the first and second ion implantation employs ions selected from the group comprising boron ions, boron di-fluoride ions, argon ions, and xenon ions.

28. The method of claim 25, wherein the dose of the first implanting ion is from about 1315 to 1E16 at an ion implantation energy of from about 30 to 200 keV, and the dose of the second implanting ion is from about 1E15 to 1E16 at an ion implantation energy of from about 30 to 200 keV.

29. The method of claim 25, wherein the blanket etch stop layer has a thickness of about 1000 Angstroms.

* * * * *